(12) United States Patent
Fan

(10) Patent No.: US 9,722,151 B2
(45) Date of Patent: Aug. 1, 2017

(54) QUANTUM DOTS (QD) GLASS CELLS, AND THE MANUFACTURING METHODS AND APPLICATIONS THEREOF

(71) Applicant: Shenzhen China Star Optoelectronics Technology Co., Ltd., Shenzhen, Guangdong (CN)

(72) Inventor: Yong Fan, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 0 days.

(21) Appl. No.: 14/772,154

(22) PCT Filed: Aug. 12, 2015

(86) PCT No.: PCT/CN2015/086790
§ 371 (c)(1),
(2) Date: Sep. 2, 2015

(87) PCT Pub. No.: WO2017/024562
PCT Pub. Date: Feb. 16, 2017

(65) Prior Publication Data
US 2017/0047489 A1    Feb. 16, 2017

(30) Foreign Application Priority Data
Aug. 10, 2015  (CN) .......................... 2015 1 0486468

(51) Int. Cl.
*H01L 33/50* (2010.01)
*B82Y 20/00* (2011.01)
(Continued)

(52) U.S. Cl.
CPC .......... *H01L 33/507* (2013.01); *H01L 33/505* (2013.01); *B82Y 20/00* (2013.01);
(Continued)

(58) Field of Classification Search
CPC combination set(s) only.
See application file for complete search history.

(56) References Cited

U.S. PATENT DOCUMENTS

| 2009/0001349 A1* | 1/2009 | Kahen ................. H05B 33/145 257/9 |
| 2012/0270231 A1* | 10/2012 | Smith .................... C09K 11/02 435/7.2 |

(Continued)

FOREIGN PATENT DOCUMENTS

| CN | 203071128 U | 7/2013 |
| CN | 103681990 A | 3/2014 |

(Continued)

OTHER PUBLICATIONS

Search Report, International Bureau.

*Primary Examiner* — Mamadou Diallo
(74) *Attorney, Agent, or Firm* — Andrew C. Cheng

(57) ABSTRACT

A QD glass cell includes a glass cell and QD fluorescent powder material. The glass cell includes a receiving chamber, and the QD fluorescent powder being encapsulated within the receiving chamber. A manufacturing method of the QD glass cell includes: S101: manufacturing a glass cell comprising a receiving chamber, and the glass cell comprising an injection port transmitting fluid into the receiving chamber; S102: manufacturing fluid QD fluorescent powder material; S103: filling the fluid QD fluorescent powder material into the receiving chamber via the injection port; S104: applying a curing process to the fluid QD fluorescent powder material within the receiving chamber; and S105: sealing the injection port by hot melting to obtain the QD glass cell. In addition, the above QD glass cell may be applied to LED light source.

8 Claims, 3 Drawing Sheets

(51) Int. Cl.
    *B82Y 40/00*    (2011.01)
    *B82Y 30/00*    (2011.01)
(52) U.S. Cl.
    CPC ............... *B82Y 30/00* (2013.01); *B82Y 40/00* (2013.01); *H01L 33/501* (2013.01); *H01L 33/502* (2013.01); *H01L 2933/0041* (2013.01); *Y10S 977/774* (2013.01); *Y10S 977/824* (2013.01); *Y10S 977/825* (2013.01); *Y10S 977/89* (2013.01); *Y10S 977/95* (2013.01)

(56) References Cited

U.S. PATENT DOCUMENTS

| | | | |
|---|---|---|---|
| 2014/0098515 A1* | 4/2014 | Pickett | G09F 13/02 362/23.13 |
| 2014/0137941 A1* | 5/2014 | Orsley | A01G 9/02 136/259 |
| 2015/0214445 A1* | 7/2015 | Qiu | H01L 27/15 257/88 |
| 2015/0228850 A1* | 8/2015 | Zheng | H01L 33/40 257/13 |
| 2015/0260373 A1* | 9/2015 | Li | C09K 11/88 362/355 |
| 2016/0181482 A1* | 6/2016 | Borrelli | C09K 11/025 257/98 |
| 2016/0268486 A1* | 9/2016 | Harris | H01L 33/483 |
| 2016/0322543 A1* | 11/2016 | Jeon | H01L 33/505 |

FOREIGN PATENT DOCUMENTS

| | | |
|---|---|---|
| TW | 201530829 A | 8/2015 |
| WO | WO2015004577 A1 | 1/2015 |

\* cited by examiner

QUANTUM DOTS (QD) GLASS CELLS, AND THE MANUFACTURING METHODS AND APPLICATIONS THEREOF

BACKGROUND OF THE INVENTION

1. Field of the Invention

The present disclosure relates to quantum dots (QD) technology, and more particularly to a QD glass cell and the manufacturing method thereof, and the corresponding applications in LED light sources.

2. Discussion of the Related Art

LCDs are characterized by attributes such as thinner, power-saving, and low radiation, and thus have been greatly adopted in mobile phones, digital cameras, computers, and TV panels. Currently, most of the LCDs are backlight type, which includes a liquid crystal panel and a backlight module opposite to the liquid crystal panel. The backlight module provides a display light source to the liquid crystal panel such that the liquid crystal panel may display images. With the development of the technology, users demand toward high performance of liquid crystal panel have been increased. In order to enhance the color saturation, the chromaticity of the display images may be improve by enhancing the chromaticity of the light bars within the backlight module. Currently, the chromaticity may be enhanced by adopting quantum dots (QD) technology.

QD may also be called as nano-crystal, which is composited by a limited number of atoms whose size in three dimensions are all within the nanoscale. Usually, the QD may be manufactured by semiconductor materials, such as elements in II~VI group or III~V group, and the diameter of the nano-particle may be in a range of 1 and 10 nm. The QD is complex of atoms and molecules within the nanoscale. The QD may include one semiconductor group, such as II and VI group (CdS, CdSe, CdTe, and ZnSe), or III and V group (InP and InAs). In addition, the QD may include two or more than two semiconductor groups. QD is of the semiconductor nano-structure binding the conduction band electrons, the holes in the valence band, and exciton in three dimensions. As the conduction band electrons and the holes in the valence band are limited by quantum, the continuous energy band structure converts into discrete energy structure, which may emit fluorescent lights after being activated. QD may be applied into lighting and display fields by changing the attributes of the wavelength of the incident lights via the crystals having different sizes. Thus, the color may be precisely controlled by configuring the sizes of the crystals.

Full width at half maximum (FWHM) of QD is usually small, such as in a range of 20 nm and 50 nm, and thus is feasible for backlight. With respect to the LCDs having QD fluorescent powder backlight, the color range may be better than the LCDs having YAG fluorescent backlight for at least 50%. Thus, such LCDs may be more vivid and the stereoscopic performance is better.

Currently, QD fluorescent powder may be applied to the LED light source. Mainly, after the LED chip is encapsulated, the QD fluorescent powder and silica gel are mixed and then are coated on a light emission surface of the LED chip to form a QD fluorescent powder film. The QD fluorescent powder may be invalidated due to oxidation, and quenching effects with respect to the temperature is serious. With the temperature increment, the light emitting efficiency drops seriously. Thus, the above technical solution lacks the protection toward the QD fluorescent powder. This not only reduces the life cycle of the QD fluorescent powder, but also deteriorates the light emitting efficiency and uniformity of the light color.

SUMMARY

Thus, the QD glass cell may protect the QD fluorescent powder material well so as to overcome the issues of the conventional QD fluorescent powder material, such as short life cycle, low light emitting efficiency, and bad uniformity of light color, when being applied to the LED light source.

In one aspect, a QD glass cell includes: a glass cell and QD fluorescent powder material, the glass cell including a receiving chamber, and the QD fluorescent powder being encapsulated within the receiving chamber.

Wherein a thickness of the wall of the QD glass cell is in a range of 0.1 mm and 0.7 mm.

Wherein the QD fluorescent powder material comprises gel material and QD fluorescent powder mixed together with the gel material.

Wherein a weight percentage of the QD fluorescent powder within the QD fluorescent powder material is in a range of 1% and 20%.

Wherein the QD fluorescent powder is selected from any one of CdSe/ZnSe, CdSe/ZnS, CdS/ZnS, CdS/HgS, CdSe/ZnS/CdS, CdSe/CdS/ZnS, InP/CdS, CuInS and Graphene Oxide QDs.

Wherein the gel material is UV gel or IR gel.

In another aspect, a manufacturing method of the QD glass cell includes: S101: manufacturing a glass cell including a receiving chamber, and the glass cell including an injection port transmitting fluid into the receiving chamber; S102: manufacturing fluid QD fluorescent powder material; S103: filling the fluid QD fluorescent powder material into the receiving chamber via the injection port; S104: applying a curing process to the fluid QD fluorescent powder material within the receiving chamber; and S105: sealing the injection port by hot melting to obtain the QD glass cell.

Wherein in step S104, the curing process is one of the IR, UV, and heat curing process.

In another aspect, the above QD glass cell may be applied to LED light source.

In view of the above, the QD glass cell encapsulates the QD fluorescent powder material within the glass cell to prevent the fluorescent powder from water and humidity. As such, the life cycle of the QD fluorescent powder is extended. Compared to the conventional technology, the QD fluorescent powder of the claimed invention overcomes the conventional problems, such as short life cycle, low light emitting efficiency, and bad uniformity of light color.

BRIEF DESCRIPTION OF THE DRAWINGS

FIG. 3 is a schematic view of the glass cell before the QD fluorescent powder has been filled in.

DETAILED DESCRIPTION OF THE EMBODIMENTS

Figure 1:
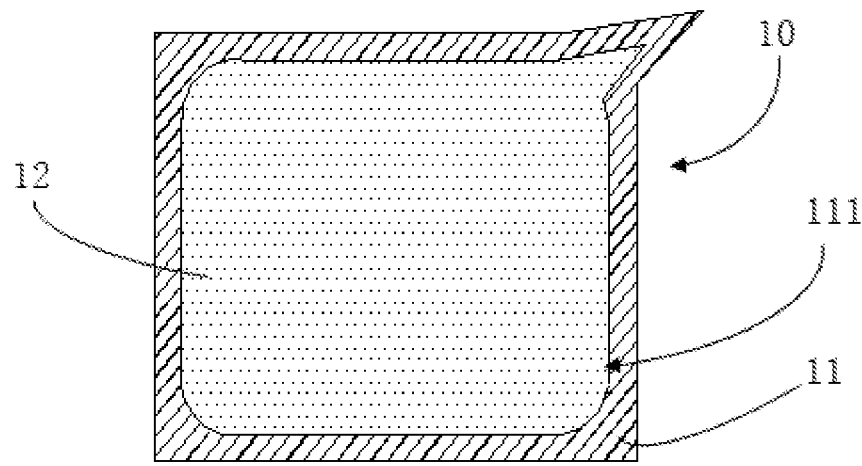
FIG. 1 is a top cross-sectional view of the QD glass cell in accordance with one embodiment.

Various example embodiments will now be described more fully with reference to the accompanying drawings in which some example embodiments are shown. In the drawings, the thicknesses of layers and regions may be exaggerated for clarity. In the following description, in order to avoid the known structure and/or function unnecessary detailed description of the concept of the invention result in confusion, well-known structures may be omitted and/or functions described in unnecessary detail.

Figure 2:
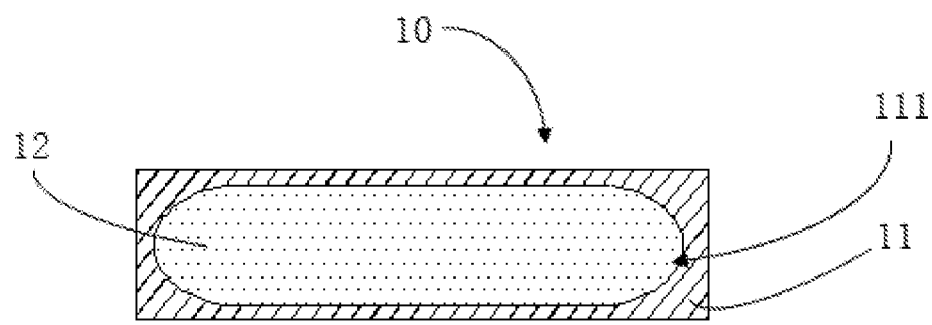
FIG. 2 is a side cross-sectional view of the QD glass cell in accordance with one embodiment.

Referring to FIGS. 1 and 2, the QD glass cell 10 includes a glass cell 11 and QD fluorescent powder material 12. Specifically, the glass cell 11 includes a receiving chamber 111, and the QD fluorescent powder material 12 is encapsulated within the receiving chamber 111.

Figure 3:
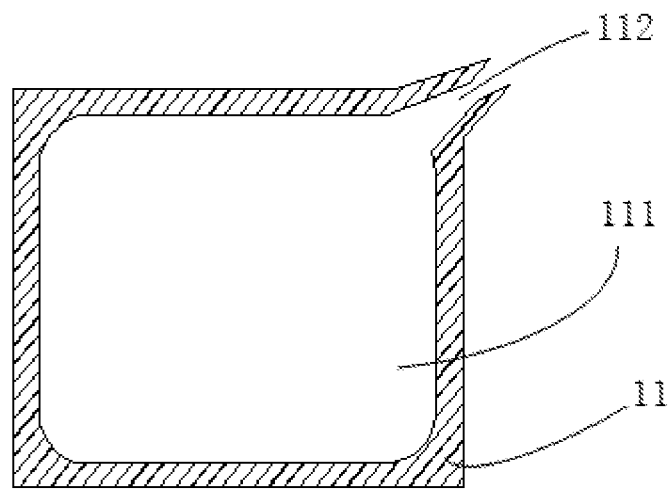

As shown in FIG. 3, before the QD fluorescent powder material 12 is encapsulated within the glass cell 11, the glass cell 11 includes an injection port 112 for transmitting fluid into the receiving chamber 111. In addition, a thickness of the wall of the QD glass cell 10 is in a range of 0.1 mm and 0.7 mm.

The QD fluorescent powder material 12 includes gel material and QD fluorescent powder mixed together with the gel material. Specifically, a weight percentage of the QD fluorescent powder within the QD fluorescent powder material may be in a range of 1% and 20%. In addition, the QD fluorescent powder may be any one of CdSe/ZnSe, CdSe/ZnS, CdS/ZnS, CdS/HgS, CdSe/ZnS/CdS, CdSe/CdS/ZnS, InP/CdS, CuInS or Graphene Oxide QDs. The gel material may be UV gel (UV-curable adhesive) or IR gel (IR-curable adhesive). As the QD fluorescent powder has not be mixed with silica gel, the QD fluorescent powder is prevented from being aggregated by selecting the UV gel or IR gel that can mixed with the fluorescent powder in a more uniform way.

Figure 4:
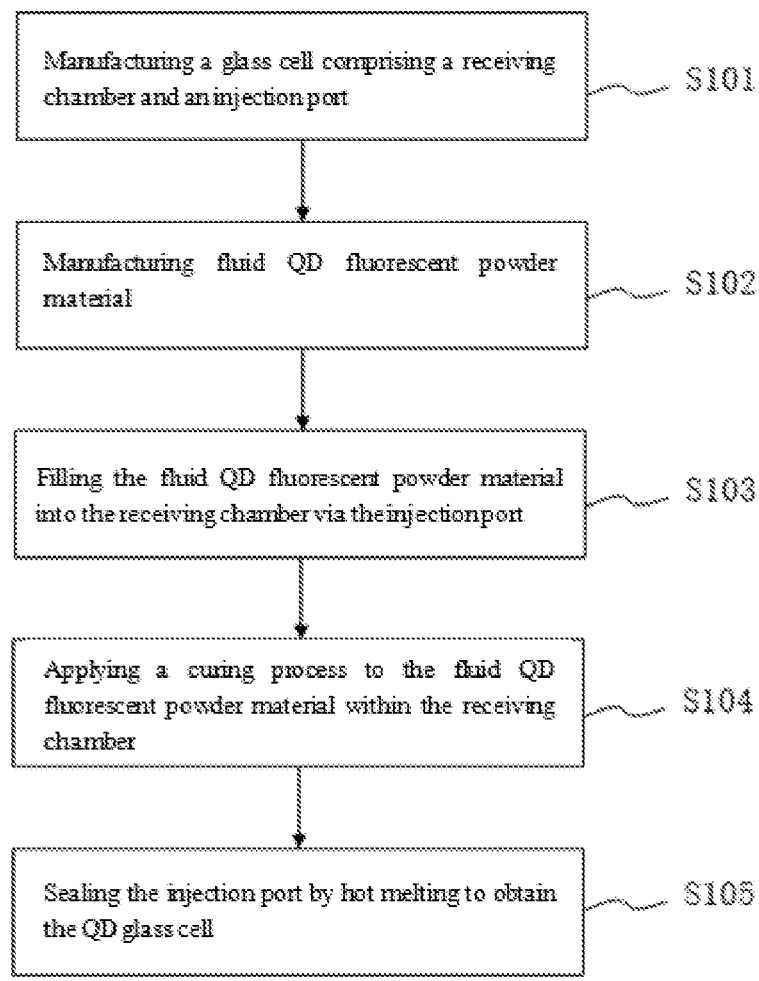
FIG. 4 is a flowchart illustrating the manufacturing method of the QD glass cell in accordance with one embodiment.

FIG. 4 is a flowchart illustrating the manufacturing method of the QD glass cell in accordance with one embodiment. The method includes the following steps.

In block S101, the glass cell having the receiving chamber and the injection port is manufactured. As shown in FIG. 3, the glass cell 11 includes the injection port 112 for transmitting the fluid into the receiving chamber 111.

In block S102, the QD fluorescent powder material is manufactured. Specifically, the QD fluorescent powder and gel material are obtained in accordance with a predetermined ratio. Afterward, the QD fluorescent powder and the gel material are mixed uniformly.

In block S103, the fluid QD fluorescent powder material is filled into the receiving chamber via the injection port.

In block S104, a curing process is applied to the fluid QD fluorescent powder material within the receiving chamber. Specifically, the curing process may be the IR, UV, or heat curing process.

In block S105, the injection port is sealed by hot melting so as to obtain the QD glass cell.

Figure 5:
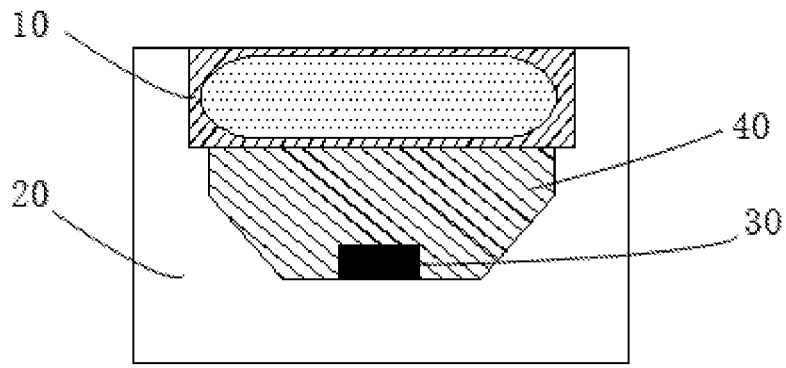
FIG. 5 is a schematic view of the LED light source in accordance with one embodiment.
Figure 6:
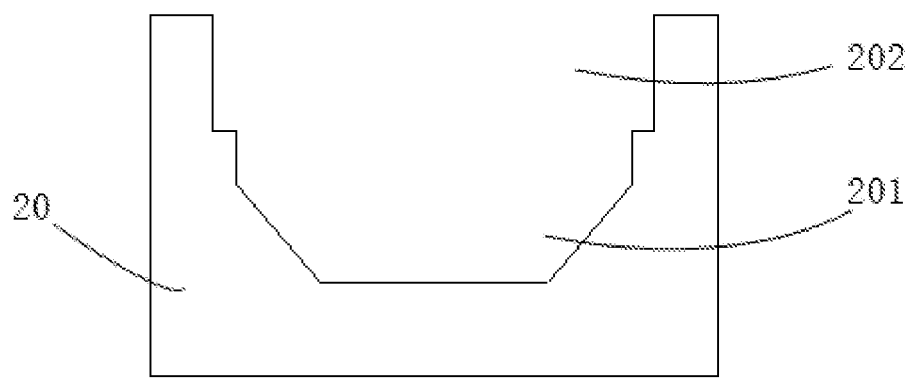
FIG. 6 is a schematic view of the fixation of the LED light source in accordance with one embodiment.

In the embodiment, the QD glass cell 10 may also be applied to the LED light source. As shown in FIG. 5, the LED light source includes a fixation 20. An encapsulation slot 201 and an installation slot 202 are arranged along a direction from a bottom to a top of the fixation 20. The width of the installation slot 202 is larger than the width of the encapsulation slot 201. A LED chip 30 is encapsulated within the encapsulation slot 201 by packaging adhesive. The QD glass cell 10 is arranged within the installation slot 202. Light beams emitted from the LED chip 30 pass through the first polarizer 40 and then enter the QD glass cell 10. In this way, the QD fluorescent powder within the QD glass cell 10 is activated so as to emit fluorescent light beams.

In view of the above, the QD glass cell encapsulates the QD fluorescent powder material within the glass cell to prevent the fluorescent powder from water and humidity. As such, the life cycle of the QD fluorescent powder is extended. Compared to the conventional technology, the QD fluorescent powder of the claimed invention overcomes the conventional problems, such as short life cycle, low light emitting efficiency, and bad uniformity of light color.

It should be noted that the relational terms herein, such as "first" and "second", are used only for differentiating one entity or operation, from another entity or operation, which, however do not necessarily require or imply that there should be any real relationship or sequence. Moreover, the terms "comprise", "include" or any other variations thereof are meant to cover non-exclusive including, so that the process, method, article or device comprising a series of elements do not only comprise those elements, but also comprise other elements that are not explicitly listed or also comprise the inherent elements of the process, method, article or device. In the case that there are no more restrictions, an element qualified by the statement "comprises a . . . " does not exclude the presence of additional identical elements in the process, method, article or device that comprises the said element.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A quantum dot (QD) glass cell, comprising:
   a glass cell and QD fluorescent powder material, the glass cell comprising a receiving chamber, and the QD fluorescent powder being encapsulated within the receiving chamber;
   wherein the QD fluorescent powder material comprises gel material and QD fluorescent powder mixed together with the gel material, and the gel material is UV gel or IR gel.

2. The QD glass cell as claimed in claim 1, wherein a thickness of the wall of the QD glass cell is in a range of 0.1 mm and 0.7 mm.

3. The QD glass cell as claimed in claim 2, wherein a weight percentage of the QD fluorescent powder within the QD fluorescent powder material is in a range of 1% and 20%.

4. The QD glass cell as claimed in claim 3, wherein the QD fluorescent powder is selected from any one of CdSe/ZnSe, CdSe/ZnS, CdS/ZnS, CdS/HgS, CdSe/ZnS/CdS, CdSe/CdS/ZnS, InP/CdS, CuInS and Graphene Oxide QDs.

5. A LED light source, comprising:
   a quantum dot (QD) glass cell comprising a glass cell and QD fluorescent powder material, the glass cell comprising a receiving chamber, and the QD fluorescent powder being encapsulated within the receiving chamber;
   wherein the QD fluorescent powder material comprises gel material and QD fluorescent powder mixed together with the gel material, and the gel material is UV gel or IR gel.

6. The LED light source as claimed in claim 5, wherein a thickness of the wall of the QD glass cell 10 is in a range of 0.1 mm and 0.7 mm.

7. The LED light source as claimed in claim 6, wherein a weight percentage of the QD fluorescent powder within the QD fluorescent powder material is in a range of 1% and 20%.

8. The LED light source as claimed in claim 7, wherein the QD fluorescent powder is selected from any one of CdSe/ZnSe, CdSe/ZnS, CdS/ZnS, CdS/HgS, CdSe/ZnS/CdS, CdSe/CdS/ZnS, InP/CdS, CuInS and Graphene Oxide QDs.

* * * * *